United States Patent [19]
Viebach

[11] Patent Number: 6,104,243
[45] Date of Patent: Aug. 15, 2000

[54] INTEGRATED TEMPERATURE-COMPENSATED AMPLIFIER CIRCUIT

[75] Inventor: Michael Viebach, Kolbermoor, Germany

[73] Assignee: STMicroelectronics GmbH, Grasbrunn, Germany

[21] Appl. No.: 09/322,966

[22] Filed: May 28, 1999

[30] Foreign Application Priority Data

May 29, 1998 [DE] Germany .......................... 198 24 199

[51] Int. Cl.$^7$ ...................................................... H03F 3/45
[52] U.S. Cl. .......................... 330/256; 330/289; 327/350
[58] Field of Search .................................... 330/256, 289; 327/350, 362

[56] References Cited

U.S. PATENT DOCUMENTS

| | | | |
|---|---|---|---|
| 5,047,730 | 9/1991 | James et al. ............................ | 330/289 |
| 5,352,973 | 10/1994 | Audy ...................................... | 330/256 |
| 5,677,561 | 10/1997 | Jensen .................................... | 327/350 |

FOREIGN PATENT DOCUMENTS

| | | |
|---|---|---|
| 215 222 | 10/1984 | Germany . |
| 3-6906 | 1/1991 | Japan . |

*Primary Examiner*—Robert Pascal
*Assistant Examiner*—Patricia T. Nguyen
*Attorney, Agent, or Firm*—Theodore E. Galanthay; Robert Iannucci; Seed IP Law Group PLLC

[57] ABSTRACT

In a fully integrated logarithmic amplifier, an input current is fed via a diode, and in a reference current branch parallel thereto, a constant current flows through a similar diode. A voltage divider forms of the differential voltage between the two diodes a partial voltage on a variable resistor of the voltage divider, which is processed by a differential amplifier for forming the output signal. Parallel to the two current branches mentioned, there is provided an additional current branch having a constant current source and a diode. The differential voltage between the diode of the reference current branch and the diode in the additional current branch is also divided by a voltage divider. A differential amplifier forms of the voltage on the variable resistor of the voltage divider an error signal which changes the variable resistance from which the differential amplifier has formed the error signal as well as the resistance fo the variable resistor of which the output signal is formed. As the voltage in the two variable resistors of each voltage divider is temperature-independent, the output signal of the amplifier is temperature-independent as well.

22 Claims, 1 Drawing Sheet

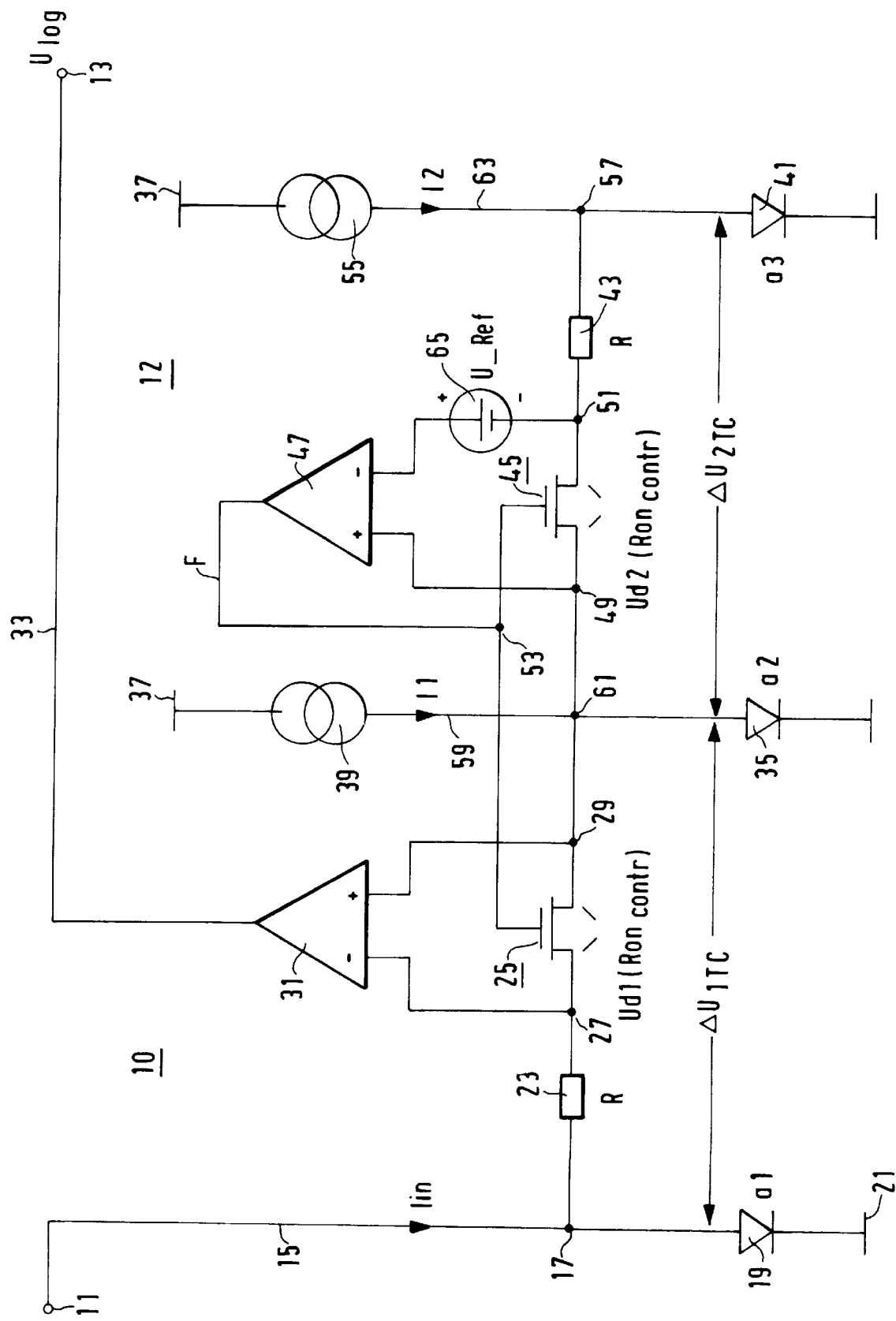

INTEGRATED TEMPERATURE-COMPENSATED AMPLIFIER CIRCUIT

TECHNICAL FIELD

The invention relates to an integrated, temperature-compensated amplifier circuit forming of an input signal, by means of a first component having a predetermined characteristics, an output signal corresponding to said characteristics.

BACKGROUND OF THE INVENTION

In the following, specific reference will be made to a logarithmic amplifier, although the invention is basically applicable to all amplifier circuits in which the characteristics fo a component, which determines the ratio fo two quantities, is used of form an input signal to an output signal that is dependent upon said characteristics.

A logarithmic amplifier is used in various fields of technology, amount others in connection with loudness regulators of audio apparatus. In such apparatus, a logarithmic amplifier serves to match the adjustment stroke to the subjective loudness sensation of the human ear.

In general, diodes or bipolar transistors are used for logarithmic amplifiers, since a diode (just like a bipolar transistor connected to operate as a diode) has a current-voltage characteristics corresponding to an exponential function, i.e., the diode current changes in about exponential manner with linearly increasing diode voltage. Thus, with an applied current, a diode voltage results corresponding approximately to a logarithm function, i.e., the inverse function an exponential function.

In a logarithmic amplifier designed as an integrated circuit (IC), an input current is usually fed into an input current circuit in which a diode (or a transistor) is provided.

Connected in parallel to this input current circuit is a reference current circuit in which a constant current source and also a diode (or a transistor, respectively) are provided, with the two components in the two current branches having as identical characteristic values as possible, in particular a defined ratio of the active component areas. Between the respective input nodes (e.g., anodes) of the diodes, a differential voltage results on the basis of the current density ratio. This differential voltage is amplified e.g., by means of a differential amplifier in order to obtain the logarithmic output signal.

A problem with such amplifiers is the dependency of the output signal on the temperature in the IC chip. Depending on the chip temperature, output signals of different magnitude are obtained for a given input current.

There are various temperature compensation measures known. With the aid of a component external to the chip, such as e.g., an ohmic resistor having a defined temperature coefficient, a temperature-dependent signal is obtained which, by suitable manners in terms of circuit technology, is processed such that the output signal of the integrated logarithmic amplifier is temperature-independent.

The wiring of a chip with external components is undesirable on principle since such additional components require considerable space on the circuit board. In addition thereto, the expenditure in manufacture is increased.

Instead of an external resistor, it is also possible to make use of a chip-internal resistor. However, in most of the integrated bipolar circuits there is no component available having a suitable temperature coefficient. To the contrary: in designing integrated circuits, efforts are made to keep possible temperature coefficients as low as possible. In order to be able to use only small temperature coefficients for temperature compensation of a logarithmic amplifier, there are complex circuits necessary.

With all known temperature compensations for logarithmic amplifier, the conformity between the temperature coefficient of the amplifier itself and the temperature coefficient of another component employed for temperature compensation is by no way ideal.

A temperature-compensated amplifier circuit for logarithmic amplification is known from JP-3-6906 A, herein incorporated by reference. As a first component, a diode is provided in the input current circuit, and in the reference current branch connected in parallel thereto, there is also provided a diode. The input signal fed to the input current circuit determines the current intensity delivered by a constant current source connected to the reference current branch. A differential amplifier forms of the voltages at the diodes a differential signal which is used for temperature compensation. Temperature compensation is carried out with the aid of a differential amplifier the non-inverting input of which is fed with the differential signal of the diode voltages and the inverting input of which is connected to a variable voltage source whose voltage value is dependent on the voltage on the diode in the input current circuit.

The publication DD 215 222, also incorporated herein by reference reveals a logarithmically operating current-voltage converter circuit in which, for conversion of the input current to the output current, a non-linear component is disposed in the feedback branch of an OP amplifier. For formation of a difference and temperature compensation, the output of this arrangement has connected thereto two also non-linear components in two parallel branches with an associated current source each. The two parallel branches are connected to the inverting and non-inverting input, respectively, of an output operational amplifier, with a linear attenuation member being disposed in one of said branches, With suitable dimensioning of the components, a temperature-dependent amplification of the temperature-dependent differential voltage formed on the non-linear components, i.e., a temperature compensation, takes place.

SUMMARY OF THE INVENTION

It is an advantage of embodiments of the invention to develop an amplifier circuit of the type indicated above which, while dispensing with external components, achieves good compensation with relatively simple means in terms of circuit technology.

This advantage is met in these embodiments with an integrated amplifier circuit of the type indicated above, which has the following features:

a) parallel to an input current branch containing the first component, there is connected a reference current branch also containing such a, second, component and supplying a constant current;

b) a first differential amplifier amplifies a value derived from the first differential voltage between the input nodes of the tow components, in order to form the output signal of the amplifier;

c) for temperature compensation, there are provided two current branches each carrying a constant current and each having a component with identical characteristics as the first and second components, as well as a second differential amplifier amplifying a value derived from the second differential voltage between the input nodes of the two components in the two current branches, in order to form an error signal;

d) for the first and second differential voltages, there is provided one controllable voltage divider each, having a partial voltage tapping means and being fed with the error signal as control signal, and e) the first and second differential amplifiers are connected to the partial voltage tapping means of the associated controllable voltage divider.

In the amplifier circuit according to embodiments of the invention, there are thus provided two pairs of components having the specific characteristics, one pair being associated with the amplifier proper that delivers the output signal, and the other pair of components serving for temperature compensation. This pair of components serving for temperature compensation, through each of which flows a defined constant current, also delivers a voltage difference that is divided by the controllable voltage divider. The second differential amplifier compares the output voltage of its associated controllable voltage divider to a temperature-independent reference voltage, so that the division ratio of this voltage divider is continuously regulated such that the temperature-dependent differential voltage at the entire controllable voltage divider delivers a temperature-independent output voltage to the partial voltage tapping means.

Because the error signal delivered by the second differential amplifier adjusts both the controllable voltage divider in the circuit part serving for temperature compensation and the controllable voltage divider in the amplifier part proper, the voltage at the partial voltage tapping means in the amplifier part itself is temperature-independent, and the output signal formed by the first differential amplifier thus is temperature-independent as well.

The circuit according to the invention is of relatively easy to construct and contains few circuit components.

In a preferred embodiment, the components are diodes or bipolar transistors, i.e., the amplifier circuit is given a logarithmic behavior. In a preferred embodiment of the invention, the controllable voltage divider in each of the two voltage dividers is constituted by a fixed ohmic resistor and a MOSFET the gate of which is fed with the error signal and the drain-source path of which constitutes a variable resistor which is dependent on the error signal present at the gate.

A specific embodiment provides that the first and second differential amplifiers are each connected to the two terminals of the variable resistor, with a temperature-independent constant voltage source being provided in the input branch of the second differential amplifier. Due to this, in the circuit part serving for temperature compensation, the output voltage of the associated voltage divider is compared by the second differential amplifier with the temperature-independent constant voltage. When the voltage on the voltage divider, and thus also on the variable resistor, increases, the second differential amplifier delivers a correspondingly higher output signal, whereby the variable resistance is slightly lowered in order to compensate again the increased voltage at the variable resistor resulting e.g., from a temperature increase. The same process takes place with the variable resistor of the voltage divider in the amplifier part proper of the circuit, so that the output signal fo the first differential amplifier is temperature-independent.

The circuit according to embodiments of the invention provides the specific advantage that it needs only very few components. The amplifier part proper with input current circuit and reference current circuit on the one hand and the circuit part for temperature compensation with its two current circuits on the other hand can each be formed separately. A particularly preferred embodiment of the invention, however, provides that one of the two current branches provided for temperature compensation is identical with the reference current source of the amplifier part proper. Thus, in this circuit there are three current branches connected in parallel, with the current branches containing components the characteristics of which are identical: the input current circuit, the reference current circuit and an additional current circuit, with the input current circuit and the reference current circuit constituting a pair, which in the following will also be referred to as "input pair", and the reference current branch and the additional current branch constituting a pair, which in the following will also be referred to as "reference pair" or "compensation pair".

For the reference pair to deliver a significant differential voltage between the two input nodes of the components (diodes), the invention provides in a preferred embodiment that the component in one of the current branches provide for temperature compensation has a large defined component area, with the current remaining the same (I1=I2), than the component in the other one of these current branches. When identical currents flow in the tow current branches of the "reference pair", the ratio of the active component areas of these branches is co-determinative for the differential voltage. With an area ration of e.g., 10:1, with the larger area being present in the component not belonging to the "input pair", a relatively high differential voltage is obtained which is favorable for good temperature compensation. What is decisive for the formation of the differential voltage is finally the current density ratio in the two components of the reference pair. The same effect can also be achieved with like areas (a2=a3) by unlike currents of e.g., 1:10.

BRIEF DESCRIPTION OF THE DRAWING

In the following, an embodiment of the invention will be elucidated in more detail by way of the drawing. The sole FIGURE shows a circuit diagram of a fully integrated logarithmic amplifier with temperature compensation.

DETAILED DESCRIPTION OF THE INVENTION

A current input 11 has an input current Iin applied thereto which, by means of the amplifier part designated in general 10 on the left-hand side of the FIGURE, is converted into an output voltage Ulog which is taken off at output 13 and is dependent on the input current Iin in accordance with a logarithm function.

At first, the amplifier part 10 is to be described in detail, The input current Iin flowing through an input current branch 15 is padded via a node 17 to the anode of a diode 19 having its cathode located at circuit ground (GND) 21.

Parallel to the input current circuit constituted by input line 15, there is provided a reference current circuit 59 between a voltage supply 37 and circuit ground (GND). Reference current branch 59 contains a constant current source 39 and a diode 35. Due to the constant current I1, there is just a temperature-dependent voltage drop taking place at diode 35. The voltage at diode 19 changes with changing input current Iin and with temperature.

The active component area a1 of diode 19 has the same size as the area a2 of diode 35, so that in the event that the input current Iin is as high as the current I1, a differential voltage $\Delta U_{1TC}=0$ is present between the two anodes of diodes 19 and 35. In case of an input current Iin different from the value indicated, a finite value results for the differential voltage $\Delta U_{1TC}$. The index "TC" stands for "temperature coefficient" and is to be understood as a hint to the effect that the differential voltage is temperature-dependent.

The differential voltage $\Delta U_{1TC}$ is divided by a voltage divider containing a fixed ohmic resistor 23 and a variable ohmic resistor 25 having the value $Ron_{contr}$.

In this embodiment, the variable resistor is provided in the form of a MOSFET (MOS field effect transistor). The voltage difference Ud1 between source and drain of the variable resistor 25 designed as MOSFET is amplified by a differential amplifier 31. The output signal 33 of differential amplifier 31 reached the output 13 a output signal Ulog.

A compensation circuit part 12 is shown on the right-hand side in the FIGURE.

The compensation circuit part 12 consists of the already mentioned reference current branch 59 and an additional current branch 63 which is connected in parallel to the latter and which, like the reference current branch, contains a constant current source 55 and a diode 41. A constant current I2 flows in current branch 63. The active component area a3 of diode 41 is ten times as large as the area a2 of diode 35.

The currents I1 and I2 in current branches 59 and 63 or the areas a2 and a3 expediently are of identical magnitude and size, respectively. When the areas a1, a2 and a3 are normalized to a1 and when the currents are normalized to I1, the following values are obtained.

1) a1=a2=1; a3=10

2) I1=I2=1; and

3) I1/a2:I2/a3=10

Area a3 is greater than a2 by a defined factor since this provides in the current values mentioned a comparatively high differential voltage $\Delta U_{2TC}$ on the "reference pair".

As an alternative, it is possible to select the areas to be of identical size and the currents to be of different magnitude, whereby the following values are obtained:

4) a1=a2=a3 =1

5) I1=10:I2=1

6) I1/a2:I2/a3=10

The differential voltage $\Delta U_{2TC}$ is divided by a voltage a divider containing a fixed resistor 43 and a variable controllable resistor 45 the value of which is designated $Ron_{contr}$.

The voltage divider in the "input pair" is of identical design as the voltage divider in the "reference pair".

Furthermore, the compensation circuit part 12 contains a differential amplifier 47 comparing the output voltage of the voltage divider to a temperature-independent constant reference voltage $U_{Ref}$ which is available on the chip in the form of a constant voltage source 65. Differential amplifier 47, at the output thereof, delivers an error signal F that is connected via a node 53 to each gate of the resistors designed as MOSFETs.

The "reference pair" on the right-hand side of the circuit operates in the same manner as the "input pair" on the left-hand side of the circuit diagram. When the temperature of the circuit as a whole rises, the differential voltage $\Delta U_{1TC}$, without compensation, would result in an increased voltage on variable resistor 25, and thus in a distorted output signal. In the following, the temperature compensation obtained by the circuit according to the invention shall be elucidated.

In case of a temperature increase, not only the operation of the amplifier part 10 proper changes, as elucidated hereinbefore, but also the operation of compensation part 12 changes. It shall be assumed that the second differential voltage $\Delta U_{2TC}$ increases due to a temperature increase. The fixed resistor 43 and the variable resistor 45 of the voltage divider first would have the tendency to have both a higher voltage. However, the increased voltage at node 49 is processed by differential voltage 47 to an increased error signal F which, via node 53, is padded to the gate of the variable resistor 45 designed as MOSFET. By increasing the gate voltage, the field effect transistor is opened slightly more, the resistance between source and drain decrease, and the voltage is reduced (while the voltage at fixed resistor 43 is simultaneously increased).

The voltage difference Ud2 on variable resistor 45 thus is temperature-independent. The voltage difference Ud1 at variable resistor 25 thus is just as temperature-independent, since the gate thereof also receives the error signal F as control signal. As the voltage Ud1 is temperature-independent (in other words: as it has no temperature coefficient), the output signal formed by differential amplifier 31 on the line 33 and at the output of circuit 13 is temperature-independent as well.

In a modified embodiment, which is not quite as favorable, the current branch 59 used here for the "input pair" on the one hand and the "reference pair" on the other hand, could also be designed separately for input pair and reference pair.

Instead of diodes 19, 35 and 41, transistors could be used as well. Basically, the diodes can be replaced by any component that has a specific characteristic through which the change of the output signal at output 13 is determined as a function of the input signal at input 11. In the circuit elucidated hereinbefore, the differential voltage $\Delta U_{1TC}$ (just as the second differential voltage $\Delta U_{2TC}$) is indeed reduced by the voltage divider so that differential amplifier 31 receives a comparatively smaller input signal, however with this input signal being temperature-independent.

What is claimed is:

1. An integrated, temperature-compensated amplifier circuit forming of an input signal, by means of a first component having predetermined characteristics, an output signal corresponding to said characteristics, said circuit comprising the following features:

an input current branch containing the first component;

a reference current branch containing a second component and supplying a constant current;

a first differential amplifier having a first input node coupled to the first component, a second input mode coupled to the second component, and an output, wherein the first differential amplifier amplifies a value derived from a first differential voltage between the input nodes in order to form the output signal of the amplifier at the output;

for temperature compensation, there are provided two current branches each carrying a constant current and each having a component with identical characteristics as the first and second components, as well as a second differential amplifier amplifying a value derived from a second differential voltage between the input nodes of the two components in the two current branches, in order to form an error signal;

for the first and second differential voltages, there is provided one controllable voltage divider each, having a partial voltage tapping means and being fed with the error signal as control signal, and the first and second differential amplifiers are connected to the partial voltage tapping means of the associated controllable voltage divider.

2. The amplifier circuit of claim 1 wherein the amplifier circuit is a logarithmic amplifier and the components are diodes or bipolar transistors.

3. The amplifier circuit of claim 1 wherein each controllable voltage divider comprises as variable resistor a MOSFET having a gate to which the error signal is supplied.

4. The amplifier circuit of claim 1 wherein each controllable voltage divider is formed of a plurality of MOSFETs having gates to which the error signal is supplied.

5. The amplifier circuit of claim 1 wherein the first and the second differential amplifier are each connected to the partial voltage tapping means of the controllable voltage divider, with a temperature-independent constant voltage source being present in one input branch of the second differential amplifier.

6. The amplifier circuit of claim 1 wherein one of the two current branches provide for temperature compensation is identical with the reference current branch.

7. The amplifier circuit of claim 1 wherein the component in one of the current circuits provided for temperature compensation has a greater or a smaller defined component area than the component in the other one of these circuits.

8. An integrated, temperature-compensated amplifier circuit including a first component having predetermined characteristics, that can accept an input signal and produce an output signal corresponding to said characteristics, said circuit comprising:

an input current branch containing the first component;

a reference current branch containing a second component and supplying a constant current;

a first differential amplifier having a first input node coupled to the first component, a second input mode coupled to the second component, and an output, wherein the first differential amplifier amplifies a value derived from a first differential voltage between the input nodes into the output signal of the amplifier at the output;

a second reference current branch carrying a constant current and having a third component with identical characteristics as the first and second components;

a second differential amplifier having a first input node coupled to the second component, a second input node coupled to the third component, and an output, wherein the second differential amplifier amplifies a value derived from a second differential voltage between the input nodes of the second differential amplifier into an error signal at the output of the second differential amplifier; and first and second controllable voltage dividers coupled to the first and second differential voltages, respectively, each controllable voltage divider having a partial voltage tapping means and being fed with the error signal as control signal, wherein the first and second differential amplifiers connected to the partial voltage tapping means of the first and second controllable voltage dividers, respectively.

9. The amplifier circuit of claim 8 wherein the amplifier circuit is a logarithmic amplifier and the components are diodes or bipolar transistors.

10. The amplifier circuit of claim 8 wherein each controllable voltage divider comprises as variable resistor a MOSFET having a gate to which the error signal is supplied.

11. The amplifier circuit of claim 8 wherein each controllable voltage divider is formed of a plurality of MOSFETs having gates to which the error signal is supplied.

12. The amplifier circuit of claim 8 wherein the first and the second differential amplifier are each connected to the partial voltage tapping means of the controllable voltage divider, with a temperature-independent constant voltage source being present in one input branch of the second differential amplifier.

13. The amplifier circuit of claim 8 wherein one of the two current branches provided for temperature compensation is identical with the reference current branch.

14. The amplifier circuit of claim 8 wherein the component in one of the current circuits provided for temperature compensation has a greater or a smaller defined component area than the component in the other one of these circuits.

15. An integrated amplifier circuit comprising:

an input current branch coupled through an input component to a reference voltage;

a first and a second reference current branch coupled respectively through first and second components to the reference voltage;

a first differential amplifier coupled between and structured to amplify a first differential voltage between the input component and the first component, the first differential amplifier having an output that is an output of the integrated amplifier circuit;

a second differential amplifier coupled between and structured to amplify a second differential voltage between the first component and the second component into an error signal;

a first controllable resistance coupled between the input component and the first component and controlled by the error signal; and a second controllable resistance coupled between the first component and the second component and controlled by the error signal.

16. The integrated amplifier circuit of claim 15 further comprising:

a first fixed resistance coupled between the input component and the first component; and a second fixed resistance coupled between the first component and the second component.

17. The integrated amplifier circuit of claim 15 the input, first, and second components are all diodes.

18. The integrated amplifier circuit of claim 17 wherein the diodes are formed of diode-coupled bipolar transistors.

19. The integrated amplifier circuit of claim 15 wherein the first and second controllable resistances are each formed of a MOSFET.

20. The integrated amplifier circuit of claim 15 wherein the input component differs in area from one of the first and second components.

21. The integrated amplifier circuit of claim 15 wherein current of one of the first and second reference current branches is the same as current in the input current branch.

22. The integrated amplifier circuit of claim 15 where the reference voltage is a ground voltage.

* * * * *